United States Patent

Kovac et al.

[11] Patent Number: 5,130,781
[45] Date of Patent: Jul. 14, 1992

[54] DAM FOR LEAD ENCAPSULATION

[75] Inventors: Caroline A. Kovac, Ridgefield, Conn.; Peter G. Ledermann, Pleasantville; Luu T. Nguyen, Hopewell Junction, both of N.Y.

[73] Assignee: IBM Corporation, Armonk, Japan

[21] Appl. No.: 593,374

[22] Filed: Oct. 1, 1990

Related U.S. Application Data

[60] Continuation of Ser. No. 405,711, Sep. 11, 1989, abandoned, which is a division of Ser. No. 181,843, Apr. 15, 1988, Pat. No. 4,881,885.

[51] Int. Cl.$^5$ .................... H01L 23/28; H01L 23/02; H01L 23/12; H01L 39/02
[52] U.S. Cl. ........................ 357/72; 357/74; 357/69; 357/80; 174/52.4
[58] Field of Search ............ 357/72, 74, 70, 69; 174/52.4

[56] References Cited

U.S. PATENT DOCUMENTS

| 4,190,855 | 2/1980 | Inoue | 357/80 |
| 4,280,132 | 7/1981 | Hayakawa et al. | 357/70 |
| 4,300,153 | 11/1981 | Hayakawa et al. | 357/80 |
| 4,330,790 | 5/1982 | Burns | 357/70 |
| 4,363,076 | 12/1982 | McIver | 361/386 |

FOREIGN PATENT DOCUMENTS 0039558 3/1982 Japan.
0031539 2/1983 Japan.

*Primary Examiner*—Rolf Hille
*Assistant Examiner*—David Ostrowski
*Attorney, Agent, or Firm*—Sughrue, Mion, Zinn, Macpeak & Seas

[57] ABSTRACT

A method and apparatus to encapsulate a device and joints coupled to conductive leads with an encapsulating material. A fixture has a recess to hold via a vacuum the device in place. Conduits in the fixture supply air around the device to form an air dam that flows outward around the device and the leads. A nozzle supplies a metered amount of material to the surface of the device. By controlling the temperature of the fixture and/or the air forming the air dam, the flow of material can be confined to the surface of the device and the joints as it cures. The method can also provide encapsulant edge capping to reduce device stresses.

5 Claims, 3 Drawing Sheets

DAM FOR LEAD ENCAPSULATION

This application is a continuation of application Ser. No. 07/405,711, filed Sep. 11, 1989, now abandoned, which was a division of application Ser. No. 07/181,843, Apr. 15, 1988, now U.S. Pat. No. 4,881,885.

BACKGROUND OF THE INVENTION

I. Field of the Invention

This invention relates to a method and apparatus to encapsulate, using a liquid resin, a surface and joints between conducting leads and contact pads on the surface of a semiconductor device.

II. Description of the Prior Art

Encapsulation of semiconductor devices including portions of the devices having terminal leads is desirable in terms of improving the reliability of the finished package. It is generally desirable to employ a liquid resin on the surface of the semiconductor device and the joints which exist between the conducting leads and the contact pads on the device surface. A variety of techniques exist in the art to provide conductive leads to semiconductor devices. Typical are devices with leads bonded to contact pads for example contact pads existing on the semiconductor chip, or contact pads existing on a chip substrate.

Typically, a large number of metallic interconnections must be coupled to an individual chip about its perimeter. One technique is known as tape automatic bonding (TAB) which employs a roll-type film cut to form an individual set of chip leads. This individual set is formed by utilizing etch techniques to obtain a personalized lead pattern which corresponds to a give chip terminal pattern. The etch pattern is employed to create a large number of identical sets. The sets are introduced one by one at the bonding station for affixation. Reference is made to U.S. Pat. No. 4.551.912 which discloses an integrated tape bonding system. Using these techniques, all leads to the chip are connected simultaneously. By employing a continuous reel transport process system through-put is enhanced. TAB is therefore very useful for achieving high production rates to couple chips to identical I/O circuitry.

Another technique involves providing leads which are bonded to a lead frame. In these devices, the semiconductor is first attached to a pad of a lead frame. This is generally recessed and located in the center of the lead frame pattern. Contact pads on the semiconductor device are then individually attached by wire bonding or by tape automated bonding to corresponding contacts on the ends of the leads of the lead frame adjacent to, but spaced from the mounting pad.

Encapsulation of the device coupled to the lead frame is known in the art as a technique of providing a finished package. Typical are the encapsulation techniques disclosed in U.S. Pat. Nos. 4,504,435 and 4,641,418. More generally packaging techniques for encapsulating electronic modules utilizing plastic materials which extend to the device/contact lead are disclosed in U.S. Pat. Nos. 3,668,299; 3,930,114; and 4,017,495.

One of the problems with prior art systems is the inability to prevent liquid from flowing onto the terminal portions of the leads which themselves extend in a cantilevered fashion beyond the surface edge of the device. This spreading occurs subsequent to the application of the drop of liquid polymeric material which was applied to the surface of the chip which has been bonded to a frame of an automated bonding tape. This liquid polymer is applied solely to the chip surface and ideally should spread out over the die surface and cover only the inner bond leads. However, the materials of choice being of a low viscosity tend to form a thin coating which wicks-out along the leads. Ultimately, such a coating extends beyond the inner lead bond areas and may travel as far as the outer lead bond areas. Such is highly undesirable since it interferes with subsequent tape excising and substrate bonding operations. More importantly this causes variability in the resulting thickness of the finished encapsulation, and may introduce undesirable stresses due to the reduced flexibility of regions of the TAB package.

SUMMARY OF THE INVENTION

It is therefore an object of this invention to provide for a method and apparatus that encapsulates, with a liquid resin, a surface and the joints between conducting leads and contact pads on the surface of a semiconductor device yet, prevents the liquid from flowing onto terminal portions of the lead.

It is a further object of this invention to provide a method and apparatus useful in microelectronic leads bonded to a semiconductor chip to control the flow of liquid resin used to encapsulate the chip itself.

Yet another object of this invention is to provide a system which is useful in sealing leads and a semiconductor chip in which leads are bonded either to a lead frame or leads bonded to a chip substrate.

A further object of this invention is to provide a system which prevents the wick-out or material overflow of a polymeric sealing material used to encapsulate a semiconductor device and its terminal leads.

These and other objects of this invention are accomplished in a method and apparatus that encapsulates a liquid resin onto the surface and the joints between conducting leads and contact pads on the surface of a semiconductor device yet prevents the liquid from flowing out onto the terminal portions of the leads. This is accomplished by forming an air dam around the semiconductor device by blowing air from below the surface as the liquid is deposited on the top of the device. The liquid is subsequently cured to form the solid encapsulant which passivates the surface and the metal contact and lead joints. This encapsulant also provides structural stability to the bonded leads holding them in place to prevent cross-over and shorting.

In accordance with this invention, the air dam air temperature, flow rate and angle of incidence are selected to control the rate and therefore the position of resin as it flows on the surface. That is, by varying temperature, air flow rate and angle of incidence of the directed air blast, resin is permitted to flow up to, for example, a chip edge or partially down the side of the chip edge or stop before reaching the chip edge and harden. Thus, edge capping of the chip's major surface may be accomplished in a controlled, reproducible manner.

As known in utilizing techniques such as tape automated bonding and the like, beam leads may project beyond a chip edge in a cantilevered fashion with the inner lead ends bonded to the chip pads which are then electrically connected to circuits and devices within the chip. The chip surface including its lead to chip pad joints ar passivated by encapsulation utilizing known polymeric materials such as epoxy based and silicon based resins. In accordance with this invention, a drop of suitable polymeric liquid is deposited onto the chip surface and then spreads. To prevent wick-out or material overflow onto the beam leads projection beyond the chip edge, air is forced up from beneath the chip by the structure which is holding the chip in place. The characteristic of the air flow, that is temperature, flow rate and angle of air flow between the beam ends and the air flow past the chip edge is adjusted to restrict material overflow onto the beam ends. This occurs, for example, by increasing liquid viscosity of the liquid drop surface at the chip edge and by momentum balance between coating deposition rate and air flow rate.

In accordance with this invention, the apparatus for accomplishing this controlled encapsulation employs an air dam fixture that holds the chip in place by means of vacuum. The chip is placed in a well with the chip surface to be encapsulated facing away from the well bottom. The surface which is not passivated contacts the well bottom which in turn is a cavity or channel permitting the vacuum to be applied to hold the chip in place. A second cavity or channel in the well permits air to flow about the periphery of the chip and between the beam leads. The chip and air flowing about can be heated by heating the fixture. This holding structure is configured to hold the chip surface to be encapsulated below the level of the leads thus permitting passivation material to flow between the leads and the chip edge and thus prevent shorting of the leads to the chip edge. After the desired thickness of encapsulation occurs, air is blown through the cavity used to initially apply the vacuum and thus lift the chip out of the well. This avoids damage to the beam ends. As will be described herein, automated encapsulation can therefore be achieved by passing through the fixture a carrier having fixed thereto a spaced series of beam lead patterns with chips bonded to the patterns. Thus, automatic processing techniques can be achieved.

This invention will be described in greater detail by referring to the attached drawings and the description of the preferred embodiment which follows.

DESCRIPTION OF THE PREFERRED EMBODIMENT

Figure 1:
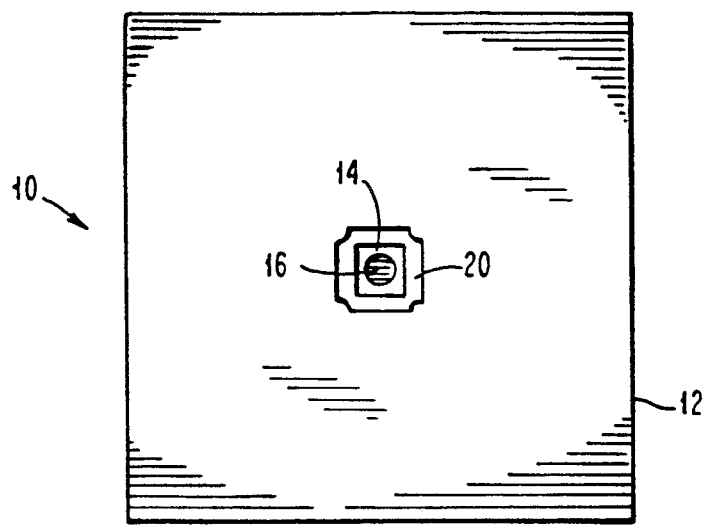
FIG. 1 is a top view of the hot air dam fixture in accordance with this invention.
Figure 2:
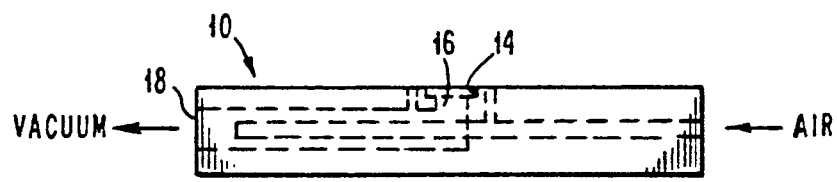
FIG. 2 is a side view of the fixture.
Figure 3:
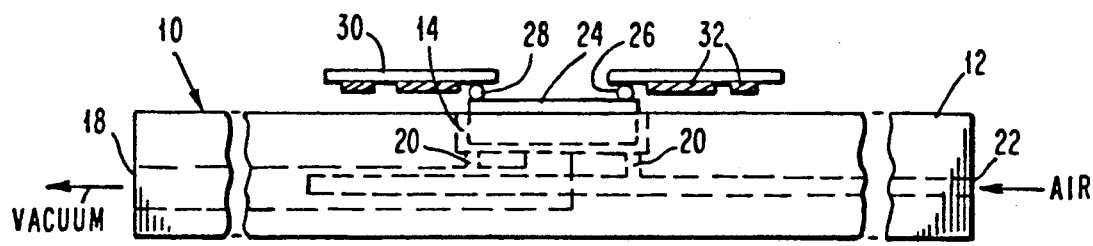
FIG. 3 is a enlarged side view of the fixture illustrated in FIG. 2 with a chip and tape in place.

Referring now to FIGS. 1-3, the hot air dam fixture of this invention is illustrated. The fixture 10 generally comprises a block of aluminum or other metal having channels machined therein to provide both air and vacuum access lines. The block has a cover plate 12 and a central recessed well 14. The recessed well is incorporated to hold in place a chip, as will be described herein.

Disposed in the center of the well 14 is a vacuum port 16. The vacuum port 16 extends downward and then through a channel 18 to a vacuum source, not illustrated.

Disposed at the periphery of the well 14 and around the vacuum port 16 are a series of openings 20 to provide air about the periphery of the chip. The openings 20, as illustrated in FIG. 3 are all coupled to a common manifold 22 channelled in the block 10 which receives air from an air source, not illustrated.

As illustrated in FIG. 1, the openings 20 are placed to provide air flow past the beam ends and along the chip edges. As illustrated in FIG. 3, a chip 24 is placed in the well 14. The chip is placed so that a vacuum applied through opening 16 tends to force the backside of the chip 24 into the well 14. As illustrated in FIG. 3, the action of this vacuum holds the chip down in a position sufficiently level so that a uniform coating can ultimately be achieved.

The chip 24 has a series of peripheral terminals 26, 28. A tape having a support structure 32 and a conductive lead pattern 30 is placed over the chip 24. The support is typically Mylar or polyimide, the leads a suitable conductor such as copper. As illustrated, the tape is applied with the lead frame face down and in contact with the terminals 26, 28.

Figure 4:
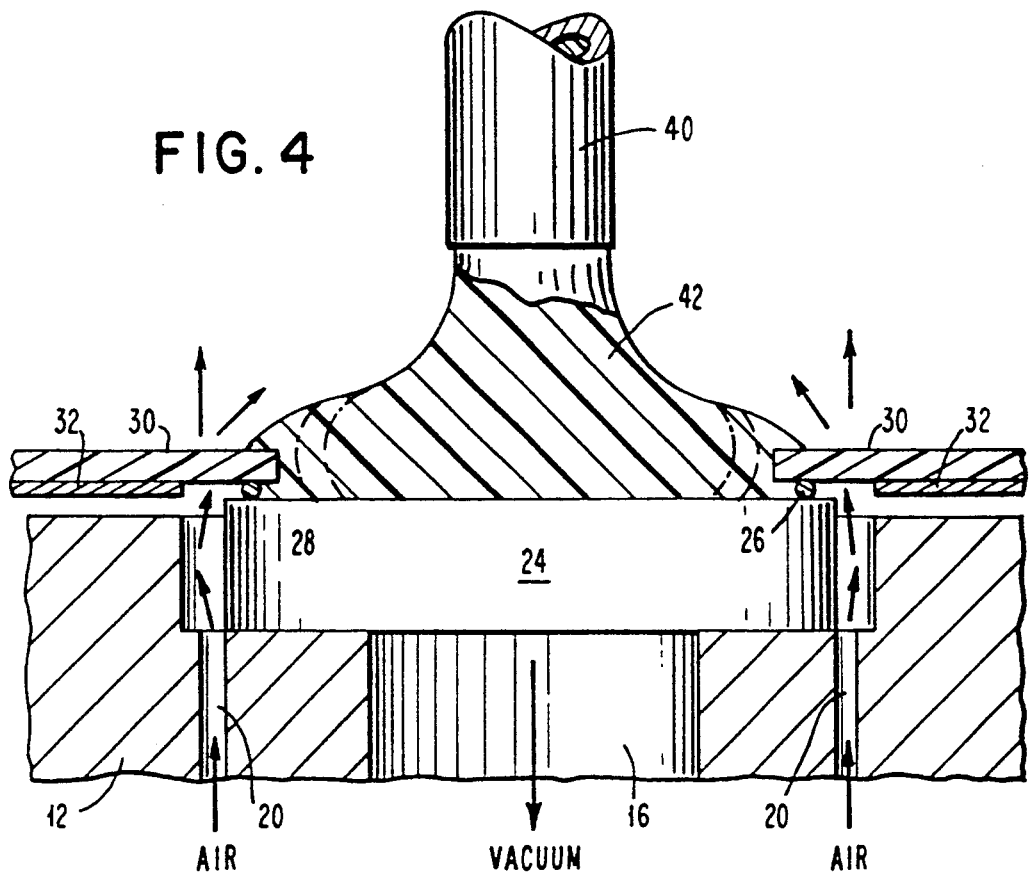
FIG. 4 is a partial side view illustrating the ejection of resin and the principles of air flow in accordance with this invention.

The block 12 may be heated either by positioning it above a hot plate or by the use of cartridge/foil heaters (not illustrated) inserted into the lower portion of the block. By either technique, air flowing into the block via conduits 20 will be heated prior to exiting between the chip 24 and the lead pattern 30. The stream of hot air flowing past the beam leads restricts the overflow of coating material onto any beam lead. As illustrated in FIG. 4, a single drop of an appropriate liquid polymer resin 42 is ejected from nozzle 40 onto the surface of chip 24. The resin being of a suitable low viscosity tends to spread out laterally along the chip surface. The hot air flow as illustrated by the arrows restricts the overflow of the coating material 42 as a consequence of a combination of one of three factors.

The first is the rapid removal of solvent from the coating which seeps onto the hot beam leads. The beam leads 30 on the tape support 32 are heated by the hot air flow admitted from the openings 20. While the polymeric material 42 has not fully cured, a loss of solvent will produce sufficient viscosity to dramatically curtail the flow front of the material. Close control of air temperature, however, needs to be carefully maintained. This is because if the vapor point of the solvent is exceeded such would cause a rapid escape so that a blister would mar the surface finish of the final component. Similarly, if the air temperature is lowered beneath the optimum temperature, such would slow down the diffusion rate of the solvent and promote resin wicking onto beam leads by capillary action. This in turn would lengthen the cycle time.

Secondly, the rapid formation of the skin of cross-linked material tends to reduce propagation of a polymeric material across the chip surface. Polymerization of any material in contact with the hot beam leads will be accelerated. The rate is highly dependent on the thermal conductivity, activation energy and reaction mechanism of the particular material being used. As a consequence of the steep temperature gradient across the coating thickness, a "skin" of highly viscous and partially cured resin will be formed almost instantly. The existence of such a layer tends to restrain any forward motion of the unreacted core within the flow front of the material 42.

Figure 6:
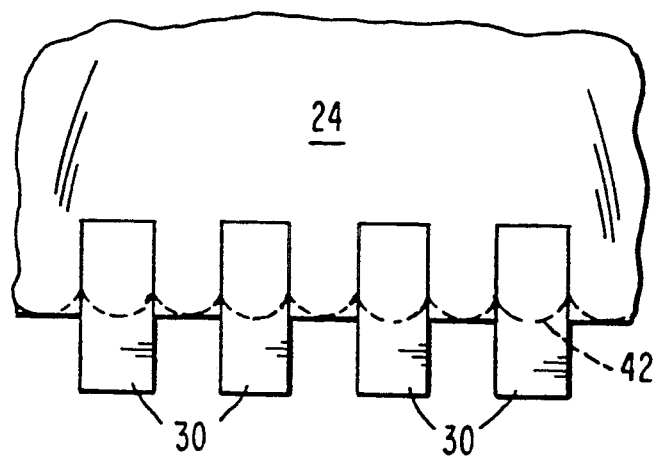
FIG. 6 is a plan view of a portion of the passivated chip of FIG. 5 illustrating the edge of the cured polymer on the chip and beams.

Thirdly, the momentum balance between the coating deposition rate and air flow tends to stabilize the propagation of the polymeric material. For both low and medium viscosity resins, this is considered to be the most important factor. Any material overflowing the boundaries delineated by the chip surface then runs over the beam ends, cover the leads, and drips through the beam spaces. The extent of this side coverage is a function of the balance between the amount of material injected and the surface tension of the material. Such is illustrated by dotted lines in FIG. 4 representing the spread of the material 42. Materials with inherently high surface tension tend to stretch over the entire beam surface rather than drip through beam spacings. The fixture 12 takes advantage of this fact by preventing any material overflow. Aside from heating the beams, the air flowing through the openings 20 exerts a force balancing any material which tends to surge beyond the chip area. Materials prevented from flowing through the spaces in turn restrain any flow into beam leads by surface tension. Thus, the air flow tends to define a barrier beyond which the flow of material is restrained. Referring to FIG. 6 the migration of the resin 42 to the edge of the chip 24 is illustrated. The resin flows over the beam ends 30 in a "scallop-like" manner curing at the discontinuity point between the beam and the chip. The upward flow of gas, typically air prevents overrunning the chip surface. Also, in the presence of an appropriate flow rate, the continuous injection of material of low viscosity onto the chip surface would allow the formation of a coating thickness much larger than would be otherwise obtained. This is a material advantage of this invention. That is, by using a lower viscosity resin, it is possible to obtain a uniform encapsulation thickness. In the absence of this invention, such would not be possible since wicking of that material would occur. Thus, prior to this invention, higher viscosity materials have been used with the problems of stresses and non-uniform coverage.

Figure 5:
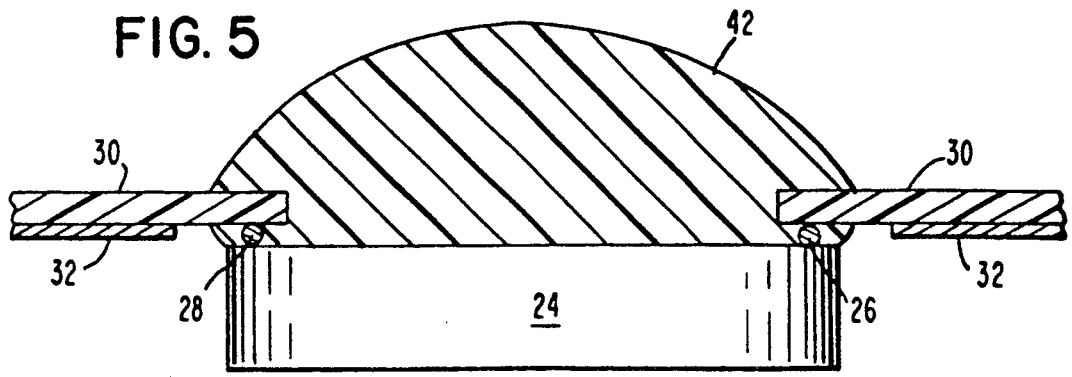
FIG. 5 is a side view of a completed passivated chip having cured polymer extending over the chip surface and the inner beam lead connection.

Referring now to FIG. 5, the finished product is illustrated. The finished product allows a liquid polymer to flow between the beam lead and the chip edge to protect against edge shorting. This is obtained by maintaining close control of the air flow to allow for such controlled wetting action. It also occurs because using a fixture as illustrated in FIGS. 1-3, the surface of the chip may be held slightly below the bottom edge of the tape to allow for polymeric flow between the beam lead and the chip edge. Once encapsulation has been applied and covers the chip to the desired thickness, the vacuum applied to the well is discontinued. A stream of compressed air is then introduced into the same passageway 16 to lift the chip out of the well prior to the onset of tape advance for the next cycle. This circumvents any damage to the beam ends resulting from any accidental encounter between the edges of chip and the walls of the well.

Figure 7A:
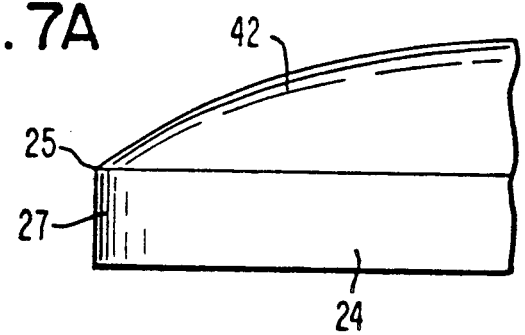
FIGS. 7A and 7B are partial side views illustrating finished passivation caps.
Figure 7B:
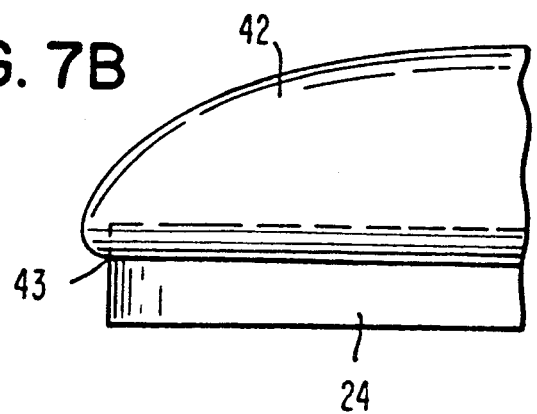

Referring now to FIGS. 7A and 7B, the encapsulation of the chip edge is illustrated. FIG. 7A depicts the device of FIG. 5 with the resin flowing to the chip edge 25 but not over the side 27. The edge 25 is a stress point and in some applications results in lift-off of the resin cap 42 by stress. Such could result in a delamination of the chip itself. To prevent this, the invention permits, by control of airflow and heat, the controlled overflow of edge 25 onto sidewall 27 forming the cap of FIG. 7B. This embodiment shifts the stress point to locations 43 on the sidewall and away from the chip major surface.

To compare the stress effects of the FIG. 7A cap to that of FIG. 7B, a finite element analysis was carried out.

TABLE I

FINITE ELEMENT ANALYSIS - SURFACE COVERAGE, NO EDGE CAPPING

| Material | Assumption | Maximum Stress Silicon (psi) Edge ILB | Maximum Stress Encapsulant |
|---|---|---|---|
| Hysol FP4322 | Plane Stress | 7,000 11,000 | 5,900 psi |
| (−40 to 150 C.) | (Plane Strain) | (11,000 15,700) | (7,800 psi) |
| Amicon 3622 | Plane Stress | <100 11,000 | 5 psi |
| (−40 to 150 C.) | (Plane Strain) | (8,000 11,100) | (<100 psi) |

TABLE II

FINITE ELEMENT ANALYSIS - EDGE CAPPING

| Material | Assumption | Maximum Stress Silicon (psi) Edge ILB | Maximum Stress Encapsulant |
|---|---|---|---|
| Hysol FP4322 | Plane Stress | 5,600 3,500 | 4,900 psi |
| (−40 to 150 C.) | (Plane Strain) | (11,100 10,000) | |
| Amicon 3622 | Plane Stress | 300 5,200 | 10 psi |
| (−40 to 150 C.) | (Plane Strain) | (8,000 19,800) | (<100 psi) |

NOTE:
In these Tables, maximum stress in the silicon occurs at the ILB bond and is a result of the stress between the aluminum bump 28 and the chip 24, independent of the type or presence of encapsulant at this thickness.
Hysol FP4322 is the frozen product form of ES4322, an anhydride-cured filled epoxy.
Amicon 3622 is a heat-cured silicone.
Model used to generate these values was for surface coverage of the entire chip with an encapsulant thickness of 16 mil.

As indicated, edge capping of FIG. 7B offers improvements in terms of reduction in stress levels.

This invention may be used with various types of coatings. Two examples are provided herein.

EXAMPLE 1

Epoxy Based Coating

Hysol liquid epoxy material (ES4322) is applied to the surface of a chip mounted in the fixture as illustrated in FIGS. 1-3. The aluminum block was heated to 90° C. When material injection was used without the benefit of air flow, the epoxy spread over the tape. However, when the air flow was blown past the leads at 20 psi, material spreading was checked and a well-coated chip was produced. The critical parameters involved were the amount of epoxy dispensed, the temperature of the fixture, and the pressure and flow of the air stream. Such can be determined by routine experimentation as a function of the material to be used.

EXAMPLE 2

Silicone Based Coating

Dow Corning silicone (3-6550) has a much lower viscosity (1,300 cps) than the Hysol epoxy as used in Example 1. The viscosity of the Hysol epoxy is in the range of 50,000 cps at room temperature. Flow temperatures of both resins would naturally improve at high temperature of the fixture. The lower viscosity silicone, however, would have a higher tendency to run over the beam ends. This tends to result in a resin overflow characteristic similar to a cloverleaf pattern. In the presence of an air flow, more complete coverage of the chip can be achieved for different coating thicknesses without any spreading.

This invention is subject to modifications and variations without departing from the essential scope. While the invention has been discussed with respect to tape automated bonding applications, the invention may be extended to be used with any coating operation requiring coverage for a given thickness. One particular use would involve initial passivation of a high I/O chip wire bonded to a lead frame. Injecting a thin layer of a low viscosity resin onto the chip allowing the material to react would provide some measure of protection against wire cross-over and shorting. Moreover, the wide latitude of coating thickness is possible if the fixture permits this passivation step to replace conventional transfer molding operation.

Having described my invention, we claim:

1. A semiconductor device comprising:
a semiconductor chip having a series of contact pads on a surface thereof;
a group of conducting leads connected to said contact pads to form joints, said leads comprising a tape, a conductive lead pattern on said tape, said tape having a support structure for said lead pattern; and
an encapsulation material covering said surface and said joints and extending over an edge of said surface to encapsulate said edge and covering said lead pattern but not said support structure.

2. A semiconductor device comprising;
a chip having a major surface, a series of conductive contacts on said major surface;
a plurality of conducting leads respectively coupled to said conductive contacts to form a plurality of joints; and
an encapsulation material covering both said major surface and said joints, said encapsulation material extending beyond an adjacent edge of said major surface to a sidewall of said chip in the form of a tapered lip extending over and below said edge to encapsulate said edge with said tapered lip decreasing in thickness and terminating on said sidewall.

3. The device of claim 1 wherein said support structure is selected from the group consisting of mylar and polyamide.

4. The device of claim 1 wherein said encapsulation material extends laterally beyond said edge and below said surface to encapsulate said edge.

5. The device of claim 1 wherein said encapsulation material is a polymer resin.

* * * * *

UNITED STATES PATENT AND TRADEMARK OFFICE
CERTIFICATE OF CORRECTION

PATENT NO. : 5,130,781
DATED : Jul. 14, 1992
INVENTOR(S) : Caroline A. Kovac et al.

It is certified that error appears in the above-identified patent and that said Letters Patent is hereby corrected as shown below:

On title page, item [73] "IBM Corporation, Armonk, Japan" should read

--International Business Machines Corporation, Armonk,

New York--.

Signed and Sealed this

Twenty-fourth Day of May, 1994

Attest:

BRUCE LEHMAN

*Attesting Officer*   *Commissioner of Patents and Trademarks*

UNITED STATES PATENT AND TRADEMARK OFFICE
CERTIFICATE OF CORRECTION

PATENT NO. : 5,130,781
DATED : July 14, 1992
INVENTOR(S) : Caroline A. Kovac et al.

It is certified that error appears in the above-indentified patent and that said Letters Patent is hereby corrected as shown below:

On the title page, item [73] "IBM Corporation, Armonk, Japan" should read --International Business Machines Corporation, Armonk, New York--.

This certificate supersedes Certificate of Correction issued May 24, 1994.

Signed and Sealed this

Eighteenth Day of October, 1994

Attest:

BRUCE LEHMAN

*Attesting Officer*

*Commissioner of Patents and Trademarks*